(12) United States Patent
Chuang et al.

(10) Patent No.: US 11,456,379 B1
(45) Date of Patent: Sep. 27, 2022

(54) SPLIT-GATE TRENCH MOSFET

(71) Applicant: Diodes Incorporated, Plano, TX (US)

(72) Inventors: Chiao-Shun Chuang, Zhubei (TW); Tsung-Wei Pai, New Taipei (TW); Yun-Pu Ku, Taipei (TW)

(73) Assignee: Diodes Incorporated, Plano, TX (US)

( * ) Notice: Subject to any disclaimer, the term of this patent is extended or adjusted under 35 U.S.C. 154(b) by 36 days.

(21) Appl. No.: 17/218,415

(22) Filed: Mar. 31, 2021

(51) Int. Cl.
*H01L 29/78* (2006.01)
*H01L 29/423* (2006.01)
*H01L 29/40* (2006.01)

(52) U.S. Cl.
CPC ........ *H01L 29/7813* (2013.01); *H01L 29/402* (2013.01); *H01L 29/404* (2013.01); *H01L 29/407* (2013.01); *H01L 29/4236* (2013.01); *H01L 29/7811* (2013.01)

(58) Field of Classification Search
CPC ............. H01L 29/7813; H01L 29/4236; H01L 29/402; H01L 29/404; H01L 29/407; H01L 29/7811
See application file for complete search history.

(56) References Cited

U.S. PATENT DOCUMENTS

| | | | |
|---|---|---|---|
| 8,889,511 | B2 | 11/2014 | Yedinak et al. |
| 9,368,587 | B2 | 6/2016 | Kocon et al. |
| 2020/0212218 | A1* | 7/2020 | Kim ..................... H01L 29/1095 |

* cited by examiner

*Primary Examiner* — Joseph C. Nicely
(74) *Attorney, Agent, or Firm* — Yingsheng Tung; Steven Shaw

(57) ABSTRACT

A split-gate trench device chip has an active region in which a plurality of active trenches are disposed. The active region is enclosed by termination trenches disposed in a termination region, which extends to the edges of the chip. A gate metal lead is disposed on the device surface. The gate metal lead makes contact to gate electrodes in the active trenches through contact holes disposed in the active region. A source or a drain metal lead is also disposed on the surface. The source or the drain metal lead makes contact to the field plate electrodes through contact holes disposed outside the active region. Each active trench in the active region has a first end merge into a first termination trench and a second end separated from an adjacent second termination trench.

22 Claims, 8 Drawing Sheets

SPLIT-GATE TRENCH MOSFET

BACKGROUND

There am active cell trenches and termination trenches in a split-gate (or shielded gate) trench MOSFET device chip. Active trenches are aggregated in parallel in the active area at the center of the chip and the termination trenches are at the periphery of the chip surrounding the active cell trenches. The active trenches are laid out as long stripes with lengths coextensive with the length of the active region, and are spaced apart by mesas. Two electrodes are in each active trench—a gate electrode in the upper portion of the trench and a field plate electrode in the lower section. The gate electrode is separated from the sidewalls of the trench by a gate dielectric film, the field plate electrode is separated from the trench sidewall by a field plate dielectric film that is thicker than the gate dielectric film. Both electrodes are conductive and are formed by material such as heavily doped polysilicon. The dielectric films are usually of silicon oxides.

Bias voltages can be separately applied to the gate electrode and the field plate electrode via metal leads on chip's top surface. To access the gate electrodes is relatively straight forward because they are located near the top of the trenches closer to the chip surface. To reach the field plate electrodes is more difficult because they are located deeper in the chip. In conventional MOSFET, pick-up pads are arranged along active trench to connect to the field plate electrodes.

SUMMARY OF THE INVENTION

The Inventors of this invention observed that in the conventional design, at the edges of conventional pick-up pad, there exists a trace of gate poly left over after the gate electrode formation. Due to the close proximity of this gate poly residual and the field plate poly pick-up pad, process tolerance can be severely diminished, which leads directly to loss in production.

With this recognition, the Inventors endeavored to invent a novel device structure that is free from this process limitation. In thesis sections a brief description of the basic structure and the method of make this structure is provided. A n-channel split-gate trench MOSFET transistor is used as an exemplary device for this purpose.

A n-channel split-gate trench MOSFETs can be built on n-type silicon wafers with the following 6 layers of photomask. They are the trench mask, the poly mask, the source mask, the contact mask, the metal mask, and the passivation (PV) mask. The layout of the trench mask, the poly mask, the contact mask and the metal mask and the associated process steps will be described in later sections.

In this MOSFET there are the source terminal and the gate terminal are placed on the top surface of the chip, the drain terminal on the bottom surface of the chip. In other implementation of the invention, the source and the drain placement may be swapped. The drain structure comprises a layer of heavily doped n-type substrate and a metal film covering the substrate at the back of the chip. Over the substrate is a moderately doped n-type epitaxial layer, which includes a p-type body layer converted from the n-type epitaxial layer through ion implantation. A gate electrode and a field plate electrode are placed in each active trenches.

The p-type body region is in the mesa region between active trenches. The ion implant is performed after the formation of the field plate electrode and the gate electrode. Under the body region is the drift region, which leads into the substrate layer. The body implant is done without a mask, i.e. a patterned photoresist film to shield any portion of the wafer surface from the impinging ions, which target the mesa regions between the active trenches to convert the n-type epitaxial layer into a p-type body layer and thus create a p-n junction in the epi layer.

Surrounding the active trenches and MOSFETs is the termination region outside the active region. The termination region is most covered by a polysilicon layer, which functions as a field plate. This poly layer is left from the poly etch process with the application of the poly mask, which exposes the active trenches so the polysilicon removal from the top of the active trenches to make room for the gate electrodes. The poly material remaining in the trenches bottom portion of the active trenches forms the field plate electrodes.

In conventional MOSFET, the poly mask also covers pick-up pad areas over the active trenches. During the body implant, if any edge of the pick-up pad protrudes into the mesa area, the overhanging portion would block the p-body implant and creates in a shadow spot in the mesa region where the converting the n-epi-layer into a p-body region would fail. That can become an inadvertent current path between the source and drain. Therefore, the pick-up pads must be etched so their edges recede deeply away from the edges of the trench.

The original size of the pick-up pad is limited by the design rules which aim to pack the maximum number of active cells (active trenches) in the finite chip. After the intentional overetch of the pick-up pad poly, the final size of the pads may be comparable to the contact holes through which the field plate is connected to the metal leads over the chip.

Surrounding each pick-up pad split-gate trench MOSFET is a strip leftover after the gate poly etch back. Only a layer of gate dielectric separates the gate poly element and the pick-up pad. Given the undersized final pick-up pads and close proximity of the gate poly, in conventional devices such as MOSFETs, there is high possibility that a contact hole that is designed to be confined by the pick-up pad may breach the edge of the pad and create an electrical short. The result is undesirable lack of product reliability control.

An associated technical problem of the split-gate trench MOSFET is that the space between the end of the active trench and the termination trench affects the charge balancing. Experimental results by the Inventors show that when the two ends of an active trench are merged into the termination trench, the reverse bias breakdown performance of the device is less than when both ends are spaced apart from the termination trench, which functions as field plate. In addition, this design increases unbalance between MOSFET cells because it effectively isolates the body region of MOSFET cell from other cell.

Recognizing the drawbacks and the limitations of the conventional split-gate trench MOSFET, the Inventors invented a novel MOSFET cell structure that has eliminated the shortcomings of the conventions MOSFET. The new structure is summarized below.

Viewed from the top surface of the device chip, the new device is dived into two portions: the center is the active region in which active cells in trench forms are disposed in parallel with a length that coextensive with the active region and a width to space dimension that maximizes the cell density. From the border of the active region to the edge of the device chip is the termination region, structured to overcome premature breakdown due to the curvature of the electrostatic potential. There is also a region at the edge of the active region to transition to the termination region. In the termination region, ring shaped termination trenches laid out in contiguous sections surround the active region.

The active trenches are laid out with one end of each trench merged into a termination trench so that the field plate electrode within the termination trench and the filed plate electrode in the active trench are continuous and can stay bias to the same electrical potential. The opposite end of each active trench stands at a distance from an adjacent termination trench so the field plate electrode does not come in contact to the field plate electrode in the adjacent termination trench. The distance may be chosen to maximize the break-down voltage. In some embodiment, the distance is chosen to be the same as the mesa that separates active trenches. The end may be curved, so as the edge of the termination trench adjacent to it. This configuration reduces the electric field density.

Both active trenches and termination trenches extend from the surface of the device chip toward substrate layer at the backside of the device chip.

Since one end of each active trench is merged with a termination trench, the field plate electrode in the active trench and the field plate electrode in the termination trench are intimately fixed and the electrical potential at the termination field plate and the active field plate will remain the same. This arrangement frees the MOSFET from having to provide pick-up pads in active trenches. The relocation of the contacts away from the active region guarantees a boost in production yield as the chance of shorting between the gate electrode and the field plate electrode is completely eliminated. In the exemplary MOSFET depicted in the drawing figure, metal leads that carries field plate bias comes to contact directly to the field plate electrode in the termination trenches and through which the field plate electrodes in the active cells are also properly biased.

Therefore the MOSFET that embody the invention no longer have the yield and reliability issues associated with field plate biasing. And the reverse breakdown issue is improved with engineering the spacing between the second end of the active trench with respect to the adjacent termination trench and by the curvatures at the trench ends and the adjacent area of the termination trenches. Devices of split-gate trench MOSFETs implementing aspects of this invention thus enjoy high manufacture yield and superior device performance.

BRIEF DESCRIPTION OF DRAWING FIGURES

Figure 1:
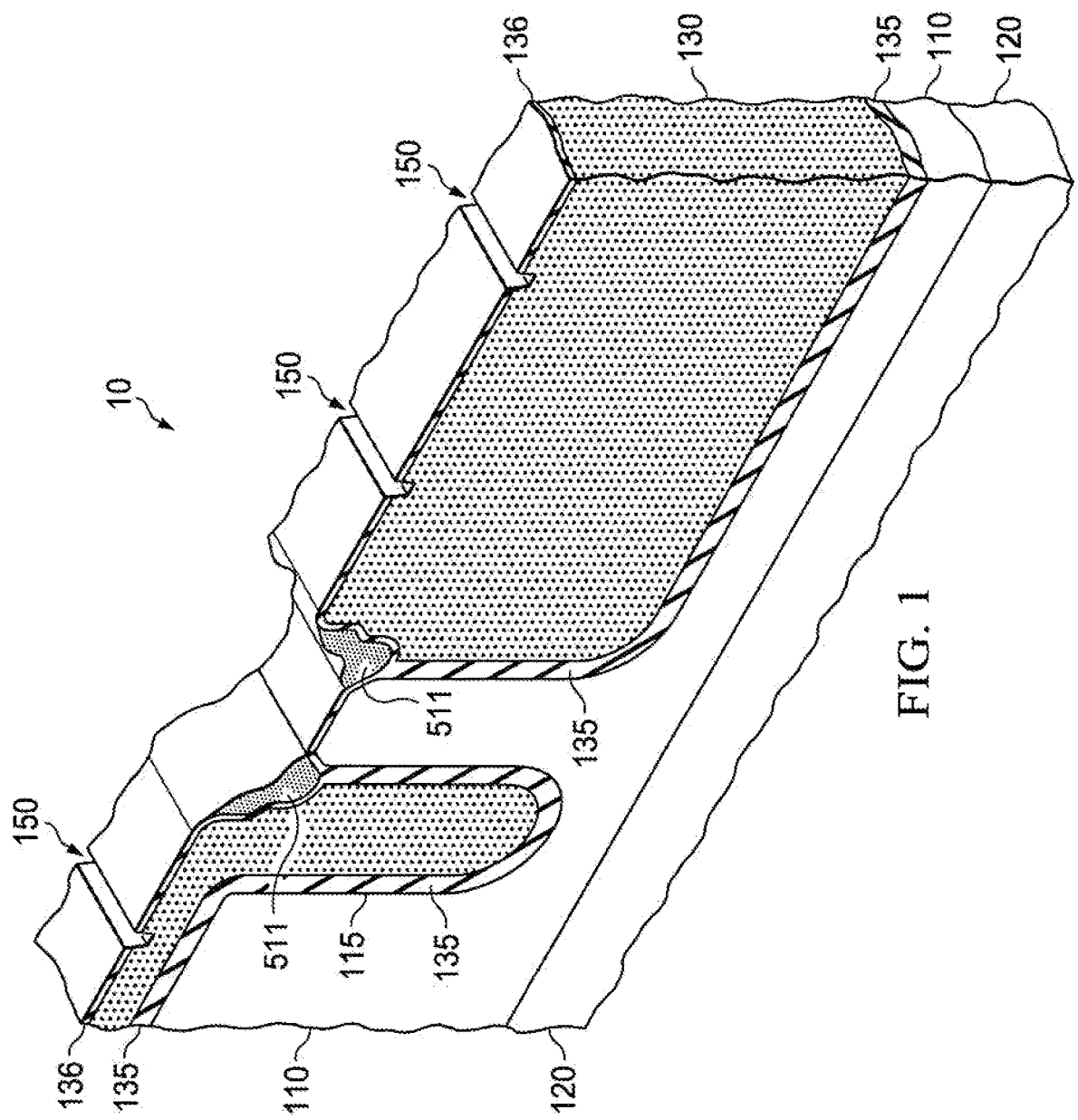
FIG. 1 depicts a perspective section view 10 of a split gate trench MOSFET device along cutline 7-7 in FIG. 5.

ELEMENTS OF THE DRAWINGS 101 termination region
102 active region
103 transition region
110 epitaxial (epi) layer
111 top chip surface
115 trench wall
120 substrate
130 field plate polysilicon
135 dielectric film
136 gate dielectric film
140 gate polysilicon
150 contact hole to field plate
210 termination trench
220 active trench
230 mesa between active trenches
240 mesa between an active trench and a termination trench
310 termination region
320 active region
420 contact to mesa
430 contact to gate polysilicon
450 contact to field plate polysilicon
510 metal connected to field plate polysilicon
511 polysilicon in sidewall recess
520 gate metal
610 field plate metal
620 gate metal
630 contact hole to gate poly
640 contact hole to body region
650 contact hole to field plate
660 dielectric film
810 source region
815 body region
820 body contact Definition of Several Terms The terms used in specification and claims generally have their ordinary meanings in the art within the context of the invention. Certain terms are further described below to provide additional guidance to the practitioners regarding the invention. It will be appreciated that the same thing may be said in more than one way. Consequently, alternative language and synonyms may be used.

In this disclosure a device chip is defined as a slab of semiconductor material cut from a wafer of silicon, gallium nitride, or silicon carbide, that hosts one or more electronic components through front-end and back-end wafer processes. The chip usually starts with a homogeneously doped wafer with two parallel surfaces of major crystallographic planes. Additional epitaxial layer or layers of semiconductor material may be then deposited on the wafer. Physical properties may be changed via diffusion or ion implant processes. Other material both conductive and insulating may be layered into or over the semiconductor layer surface to complete the device structure.

Conductive material is defined as a material of low resistivity ($<10^{-8}$ ohm-cm); Insulating or dielectric material has high resistivity ($>10^{-16}$ ohm-cm); and the resistivity of a semiconductor material lies between that of a conductor and an insulator. Semiconductor material such as polysilicon can be doped to lower its resistivity to function as a conductor.

A split-gate trench MOSFET disclosed herein is an electronic device built in a semiconductor chip and operates to pass a current along a trench structure between a source terminal and a drain terminal. The current flows in a channel in a mesa next to a trench and can be controlled by the bias applied to a gate element in the trench. A field plate element in the trench "splits" from the gate element by a dielectric film. The gate element is disposed at an upper portion of an active trench; the field plate electrode is disposed at a lower portion of the active trench. In termination trenches, there is also field plate electrode but no gate electrode.

A field plate is a conductor element that is disposed to affect the electrical field distribution in its vicinity with proper bias.

Circuit elements in semiconductor device chips are usually aggregated in the center of the chips defined as the active region. Outside the active region towards the edges of the chip is the termination region, which functions to shield the active region from the adverse effects of the scribe line or street of the chip to overcome the premature breakdown due to the curvature of the electrostatic potential. In some chips such as in the exemplary split-gate trench MOSFET described in this paper, a transition region to the termination region begins at a transition region adjacent the outside edge of the last active trench. In the transition region, the mesa is engineered to have a dopant profile different from that in the active region. The active region may be partitioned into blocks (the drawing figures only depict one such block for illustrative purpose) in which the active trenches are placed and metal pattern is designed such that leads may connect the blocks serially or in parallel or in combination for circuit consideration such as to minimize self-biasing and local heating.

The depth of a trench is measured from the top surface of the silicon portion of the device chip. The two opposing sidewalls are perpendicular to the device surface and the bottom of the trench may have a slightly curved surface. The width of a trench is the space between the two sidewalls. A mesa of semiconductor material stands between adjacent trenches. The two opposite sidewalls of a trench span the length of the trench, either butt and merge into a second trench to form a T shape structure, or form and curved end at a distance from the second trench. In the exemplary MOSFET, the trenches are lined with a dielectric such as silicon dioxide film and filled with doped polysilicon. In the active trenches there are two sections and the dioxide film are of different thicknesses in the two sections: at a bottom section the oxide film is thicker and at the upper section the oxide film is thinner. The two sections are separated by a third dielectric such as silicon oxide film.

Contact holes are pathways formed in insulating material layer to facilitate electric connection between two layers of conductive material.

Two adjacent objects are two objects disposed near each other with no intervening object of the same type as either object.

In this application, adjectives such as perpendicular, parallel, and equal do not carry their mathematical precision. They describe objects that are subject to manufacturing and measurement tolerances. Terms such as top, bottom over, and under, refer to relative positions in view of the drawing figures.

DETAILED DESCRIPTION OF EMBODIMENTS

In drawing FIGS. 1 through 8, various portions of an exemplary silicon based split gate trench MOSFET (metal oxide silicon field effect transistor) and several masks used in making the MOSFET are depicted in the drawings for the purpose of teaching a person skilled in the art to make and use the invention. The drawings are not exhaustive and the elements not to scale but are only for demonstrative purposes.

FIG. 1 depicts a slice 10 of the MOSFET chip in a perspective sectional view. The slice is within the termination region. At the bottom of drawing is the substrate 120, a silicon layer. It is usually heavily doped with a group V element such as arsenic and phosphorus for a n-type MOSFET; for a p-type MOSFET, the dopant would be of group III such as boron. Over the substrate is an epitaxial (epi) silicon layer of silicon 110. The epi layer is much more lightly doped than the substrate. The thickness of the epi layer is often dictated by the device breakdown voltage. Two termination trenches defined by the sidewalls 115 are depicted in FIG. 1 perpendicular to each other. The narrower trench is cut perpendicular to its length while and the wide trench parallel to it length. The sidewalls 115 are lined with a relatively thick layer of silicon dioxide 135. In this exemplary device, the oxide layer 135 is thermally grown. As depicted, the two trenches are filled with material 130, which in this MOSFET is doped polysilicon (poly). The poly is deposited from the top of the chip and the top portion of the deposited poly is subsequently removed. Between the two trenches is a mesa of epi silicon. The top of the mesa and the poly is covered by a relatively thin silicon oxide layer 136. Several contact holes 150 are depicted as opened through the thin oxide layer into the poly material 130.

At the upper corners of the two trenches facing each other are two pocket shaped recesses 511 recede into the trenches. The recess, which runs the length of the trench, is created after the removal the poly described in the previous paragraph. A thin oxide 136 separates the poly 130 and a second poly in the recess 511.

Figure 2:
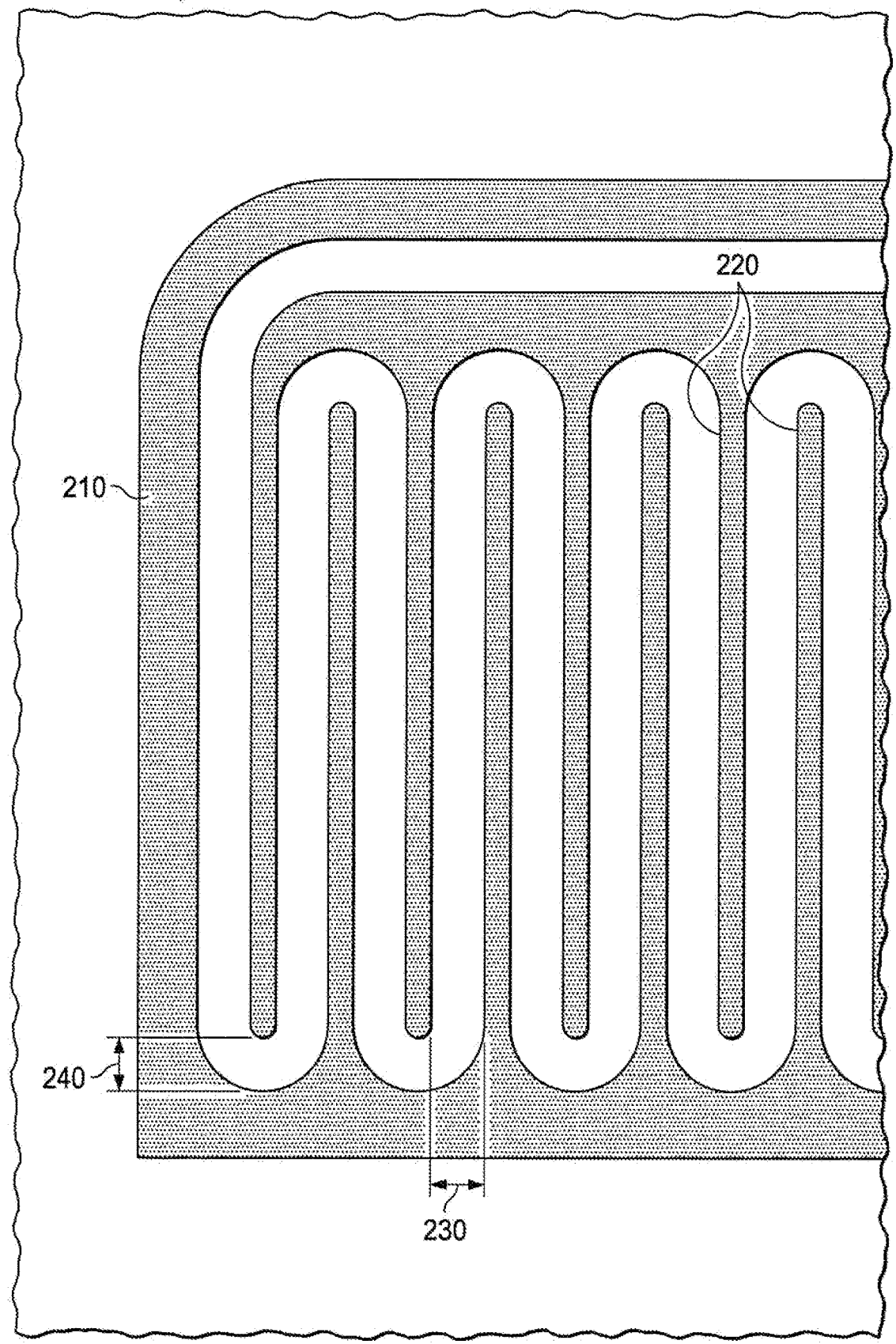
FIG. 2 depicts the top view 20 of a partial mask drawing of the trenches of the MOSFET in FIG. 1.

FIG. 2 depicts a portion of a trench mask pattern 20 that is used to create the trenches. In FIG. 2, the relatively wide trench sections are the termination trenches 210 disposed at the edge of the pattern and the relative thin and uniform in width are the active trenches 220 at the center of the pattern enclosed by the termination trenches Mesas 230 and 240 separate the trenches. Mesa 230 separates adjacent active trenches 220 and mesa 240 separates an active trench 220 from a termination trench 210. In this MOSFET design, the mesa 230 and the mesa 240 have the same width. Also, at the turns, the termination mesas are curved to maintain a constant mesa width between the termination trench and the active trench. This measure has proven to yield good breakdown voltage performance.

As depicted in FIG. 2, the trenches are laid out in a comb shape in which a group of parallel active trenches 220 merge into a perpendicular termination trench 210. FIG. 2 depicts two loosely interlocking combs of trenches. Mesas between trenches take on a contiguous serpentine form so the tips of the active trenches do not touch the handle of the opposite comb. The width of the mesa in FIG. 2 is chosen to be the same between trenches. The effect of a contiguous mesa region is a lower in the drift region resistance in the MOSFET device and free of local hot spots due to self-biasing.

Figure 3:
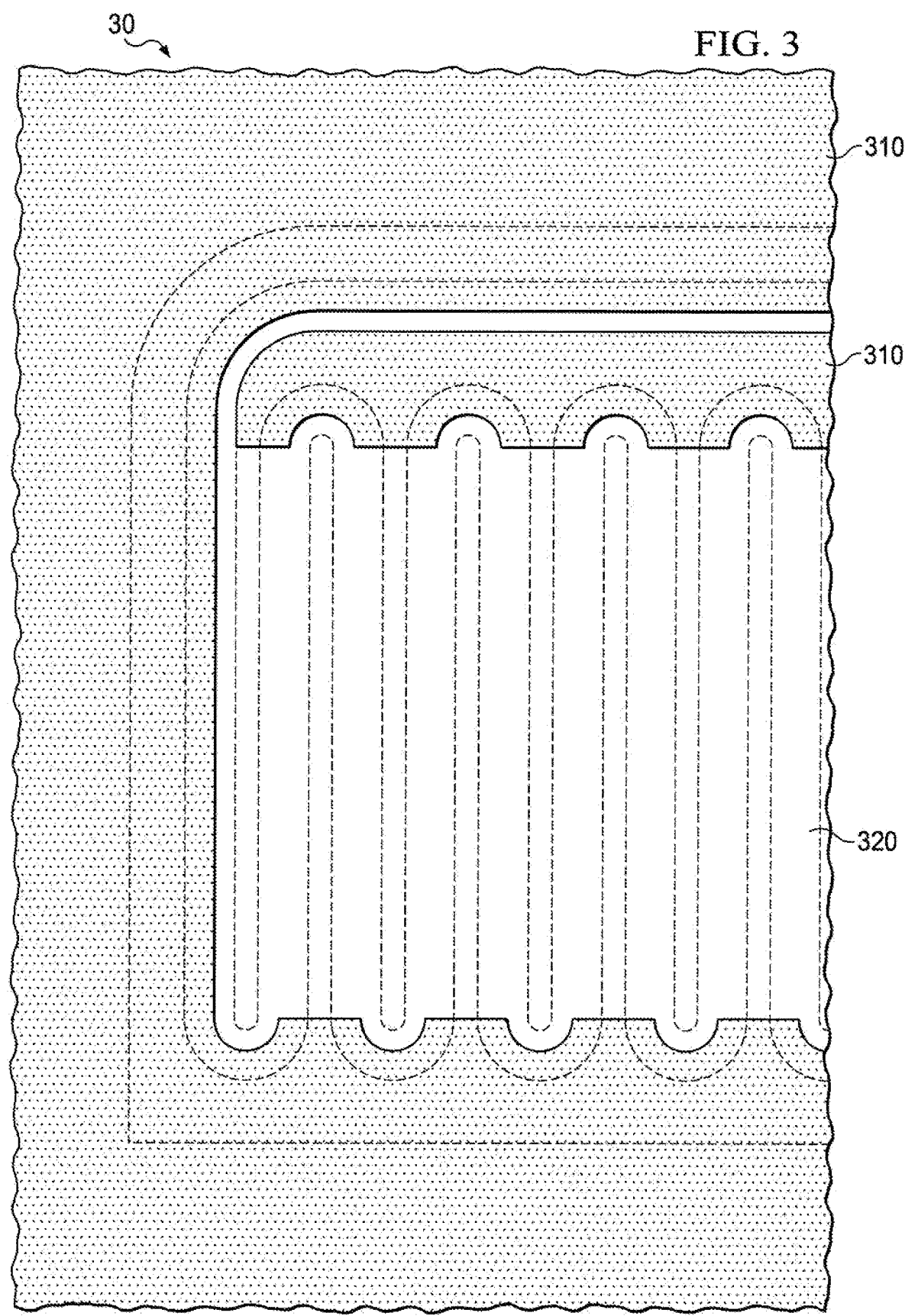
FIG. 3 depicts the top view 30 of a partial mask drawing of the active region and the termination region of the MOSFET in FIG. 1.

FIG. 3 depicts a portion of poly mask pattern 30 overlaid the trench mask pattern 20. The shaded area depicts the termination area 310 that surrounds the active area 320. During the field plate poly etch process, lateral etch encroaches the edges of the poly layer under the poly mask 30. The overetch is to clear out field plate poly from overhanging the mesa that may block body implant and source implant and that results in current leaking paths next to the trench walls.

Figure 4:
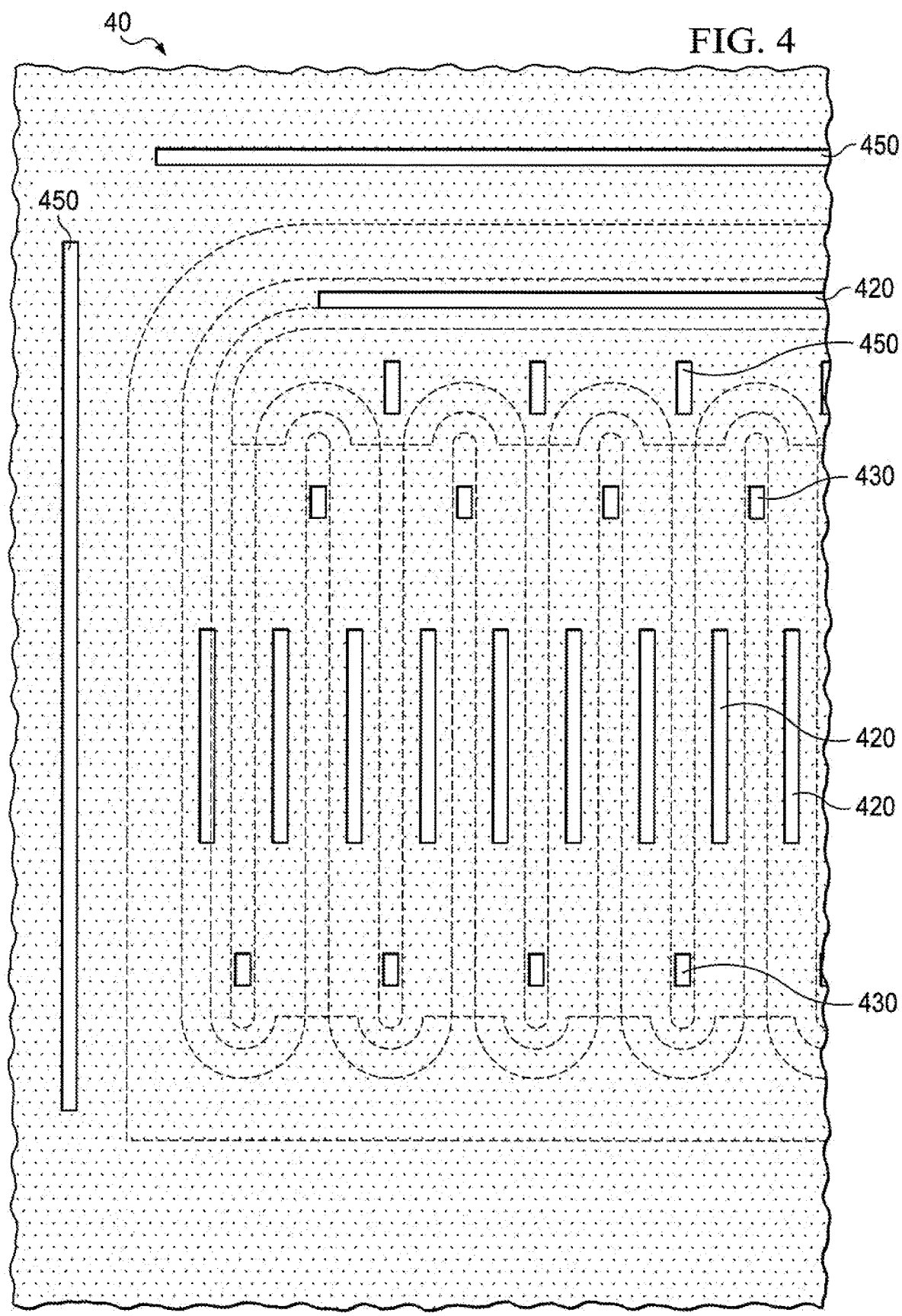
FIG. 4 depicts the top view 40 of a partial mask drawing of the contact holes of the MOSFET in FIG. 1.

FIG. 4 depicts a partial pattern of the contact mask 40 overlaying the trench mask and the poly mask. Contacts 430 are located on top of the active trenches 220 through which the gate poly receives its bias. Contacts 420 are located on top of mesas. Contacts 450 are located on top of field plate polysilicon outside the active region. This is advantageous to locate the contacts to field plate outside the active region in order to avoid inadvertent shorting between the field plate electrode and the gate electrode.

Figure 5:
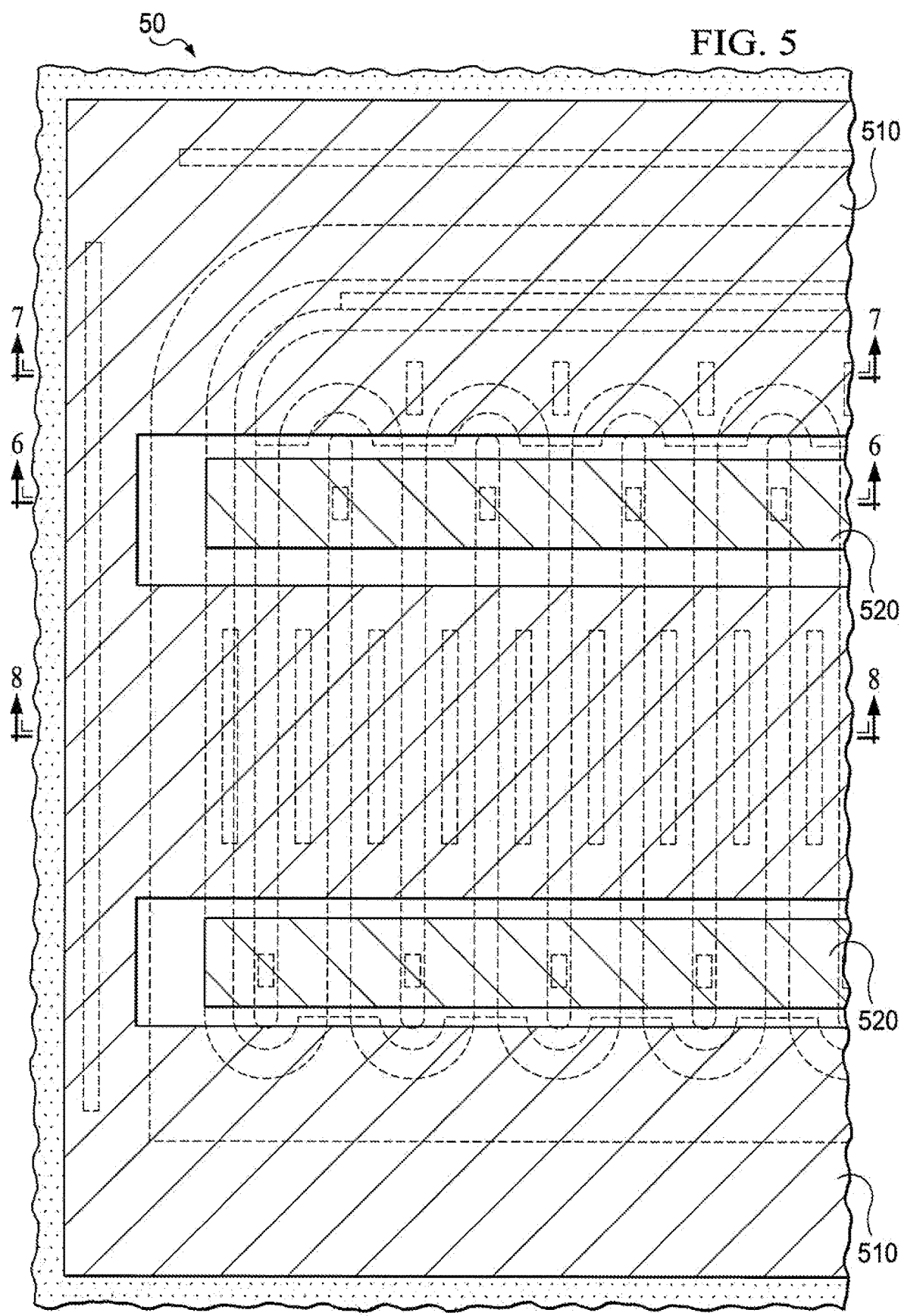
FIG. 5 depicts the top view 50 of a partial mask drawing of the metal layer of the MOSFET in FIG. 1.

FIG. 5 depicts a partial metal mask pattern 50 overlaying the trench mask, the poly mask, and the contact mask. In FIG. 5, three are two metal leads 520 flanked by a wider metal lead 510 that occupies a greater portion of the chip surface. The large metal piece 510 connects the source or to the drain terminal depending on the design of the MOSFET. For example, in the MOSFET depicted herein, the source is constructed near the top chip surface 111 and the 510 is the source metal. In other MOSFETs the drain may be configured near the top. Also depicted in FIG. 5 are three cut lines 6-6, 7-7, and 8-8. Cross sectional views of the MOSFET along the cut lines will be depicted in FIG. 6, FIG. 7, and FIG. 8.

Figure 6:
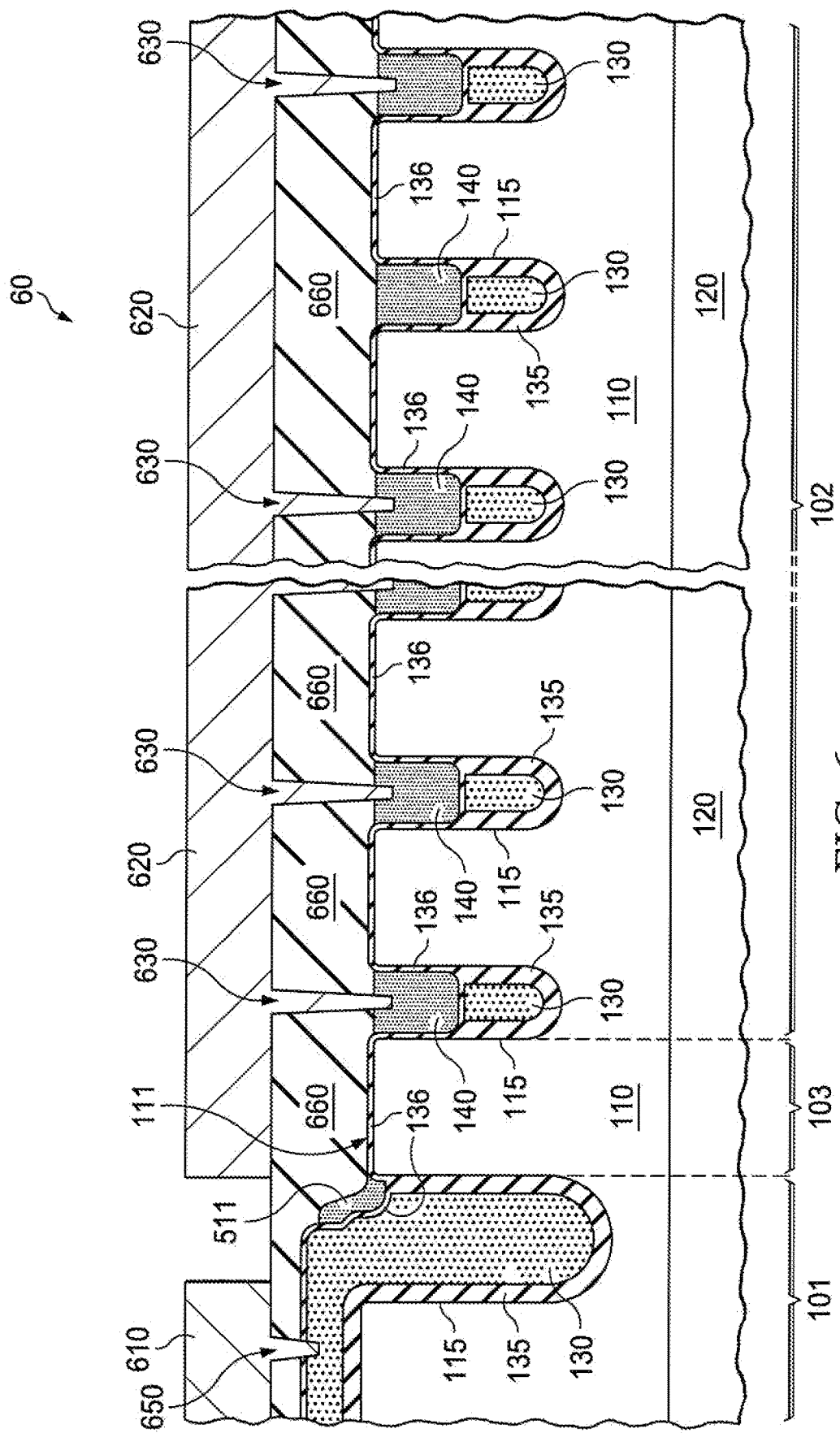
FIG. 6 depicts a partial section view 60 of the MOSFET along cutline 6-6 in FIG. 5.
Figure 7:
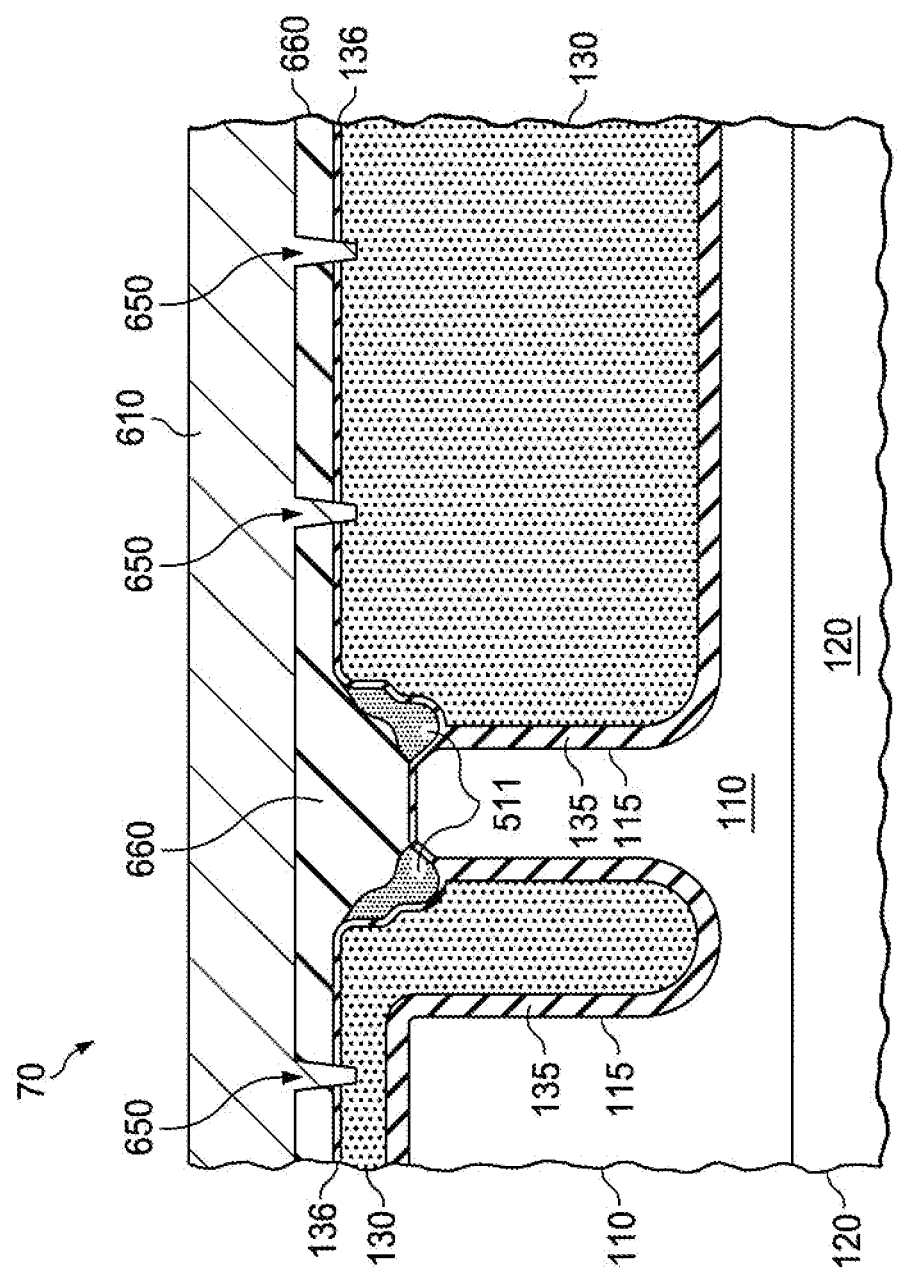
FIG. 7 depicts a partial section view 70 of the MOSFET along cutline 7-7 in FIG. 5.
Figure 8:
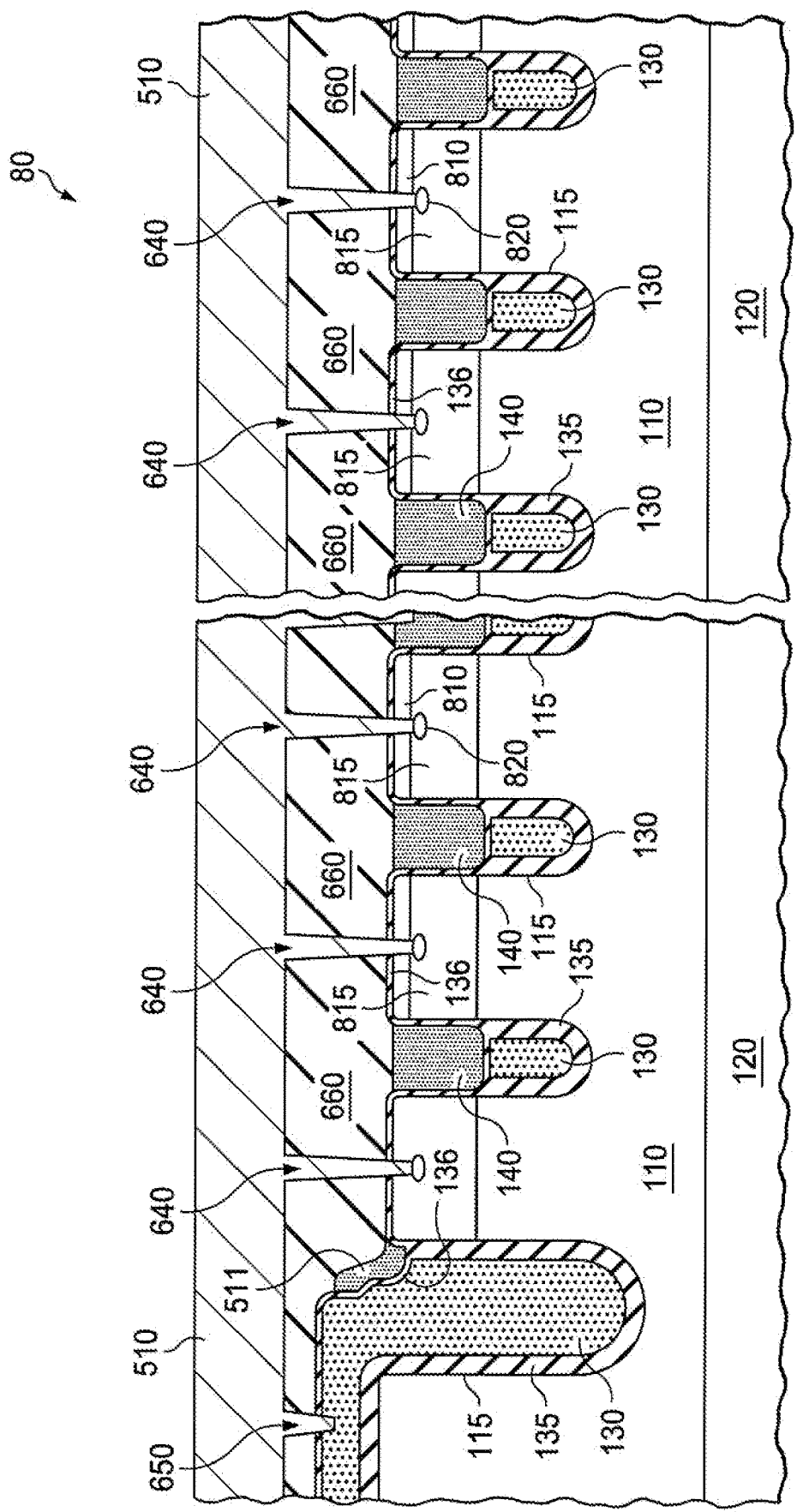
FIG. 8 depicts a partial section view 80 of the MOSFET along cutting plane 8-8 in FIG. 5.

FIG. 6, FIG. 7, and FIG. 8 depict the MOSFET near the end of the front-end fabrication process.

FIG. 6 is a cross sectional view 60 depicts a termination trench ad several active trenches in the MOSFET. The termination trench has two sidewalls 115, which are lined by a layer of silicon dioxide 135, and filled with field plate polysilicon 130. The field plate poly extends over the top surface 111 where a contact hole 650 is located. Through the contact hole metal 610 makes ohmic contact to the field plate poly 130.

FIG. 6 also depicted several active trenches. The depth and the width of the active trenches are less than that of the termination trench in this MOSFET. Each active trench has a top portion will with gate poly 140 and a lower portion filled with field plate poly 130. The field plate poly in the active trenches and in the termination trench connected at the merge points of the trenches, as depicted in FIG. 2.

The silicon dioxide that lines the top portion of the active trench is the gate dielectric 136. Silicon dioxide is only one of many dielectric materials that may be used for the gate dielectric. Other dielectric films include silicon nitride. Also depicted in FIG. 6 are contact holes 630 through which the gate poly is connected to the gate metal 620. The contact holes 650 and 630 are opened through a relatively thick dielectric layer 660, which in this exemplary MOSFET is silicon dioxide based. Other material may also be used. As depicted in FIG. 6, the contact hole 650 is far away from the recess 511.

The active trenches are aggregated in the active region 102 away from the edge of the chip. The termination trench is disposed in the termination region 101, which extends to the edge of the device chip. Between the active region and the termination region is a mesa 103, which transitions from the active region to the termination region. The transition region 103 is engineered to have a different impurity doping profile than the mesa between the active trenches.

FIG. 7 depicts the cross sectional view along cut line 7-7 in FIG. 5. This view 70 depicts two termination trenches similar to the cross sectional view in FIG. 1 with the addition of the dielectric layer 660, the contact hole 650, and the metal film 610 that connects the field plate poly in the termination trenches. It is to be noted that all the contacts to field plate are disposed at a distance from the gate poly in the recess 511 along the edge of the termination trenches to ensure good electrical isolation between the field poly and the gate poly, which are at different voltage potentials during device operation.

FIG. 8 depicts the MOSFET along the cut line 84 in FIG. 5. FIG. 8 depicts the result of the impurity doping in the mesas. Area 815 between active trenches is doped with boron to form the body region. The body region 815 next to the gate oxide 136 forms a channel in the boy region upon proper bias. The source region 810 sits over the body region is n-type in the n-MOSFET. It is to be noted that this source region is absent in the mesa of in the transition region 103. In this MOSFET, the mesa regions and the field plates share the bias vis the metal 510. If the design call for separate biasing at the mesa and the field plate, then the metal 510 that connects the body region in FIG. 8 will be separated from the metal 610 in FIG. 6 and FIG. 7. The region immediately under the contact hole 640 receives an extra boron implant to enhance the ohmic contact to the body regions.

The drawings FIG. 1 through FIG. 8 supplement the specification so the invention may be more readily understood. They are not meant to be exhaustively detailed and many elements are not repeated in every drawings for clearness purpose. The elements in the drawings are not necessarily to scale. The drawings and the associated description in the specification are only exemplary implementation of the invention and are not meant to limit the invention of which the scope is only described in the claims.

We claim:

1. A split-gate trench device chip, comprising:
   a top chip surface;
   a substrate;
   an active region enclosed by a termination region;
   termination trenches disposed in the termination region, extending from the top chip surface towards the substrate;
   a plurality of first active trenches disposed within the active region;
   each first active trench having a first end merged into a first termination trench and a second end not merged into a second termination trench;
   a first conductive material disposed in each first active trenches and in each termination trench; and
   first contact holes disposed outside the active region through which the first conductive material electrically connects a first metal lead disposed over the top chip surface.

2. The split-gate trench device chip of claim 1, in which the first metal lead leads to a source or a drain terminal.

3. The split-gate trench device chip of claim 1, further comprising a second conductive material disposed in an upper portion of each active trench over the first conductive material.

4. The split-gate trench device chip of claim 3, further comprising second contact holes disposed inside the active region through which the second conductive material makes electrical contacts to a second metal lead disposed over the top chip surface.

5. The split-gate trench device chip of claim 4, in which the second metal lead leads to a gate terminal.

6. The split-gate trench device chip of claim 5, further comprising contacts holes to mesas.

7. The split-gate trench device chip of claim 3, in which the first conductive material and the second conductive material are doped polysilicon.

8. A split-gate trench MOSFET device chip, comprising:
a top chip surface;
a substrate of doped semiconductor material;
a layer of doped epitaxial semiconductor material over the substrate;
an active region and a termination region;
a termination trench extending from the top chip surface towards the substrate, having two opposing sidewalls and a length;
a recess at one corner near the top of a termination trench receding into the termination trench and with a layer of dielectric film lining the recess; and
conductive material disposed on both sides of the dielectric film.

9. The split-gate trench MOSFET device chip of claim 8, further comprising a first conductive material filling the termination trench.

10. The split-gate trench MOSFET device chip of claim 9, in which the recess is disposed between a termination region and a transition region runs the length of the termination trench.

11. The split-gate trench MOSFET device chip of claim 9, further comprising:
a plurality of active trenches disposed in parallel across the active region extending from the top chip surface towards the substrate;
mesas of the epitaxial semiconductor material disposed between adjacent active trenches; and
a conductive material disposed at a bottom portion of each active trench, a second dielectric film covering the conductive material, and a conductive material over the second dielectric film.

12. The split-gate trench MOSFET device chip of claim 11, in which the conductive material is doped polysilicon.

13. The split-gate trench MOSFET device chip of claim 11, further comprising a gate dielectric film at the active trench sidewalls.

14. The split-gate trench MOSFET device chip of claim 13, further comprising a third dielectric film thicker than the gate dielectric film disposed at a lower portion of the active trench sidewalls.

15. A split-gate trench device chip, comprising
an active region surrounded by a termination region;
termination trenches delineating borders of the active region;
a plurality of first parallel active trenches in the active region, merged into a first perpendicular termination trench, and
a second termination trench adjacent to and spaced from the first parallel active trenches.

16. The split-gate trench device chip of claim 15, further comprising a plurality of second parallel active trenches in the active region, merged into a second perpendicular termination trench, and loosely interlocked with the first parallel active trenches.

17. The split-gate trench device chip of claim 16, further comprising contact holes disposed in active trenches reaching the active trenches and contact holes reaching into the mesas between the active trench.

18. The split-gate trench device chip of claim 16, further comprising a recess structure disposed at a corner of the termination trenches and co-extensive with a length of the termination trenches.

19. The split-gate trench device chip of claim 18, further comprising contact holes disposed outside the active region, through which a conductive material in the bottom portion of each active trench makes electrical connection to a metal lead on a top chip surface.

20. The split-gate trench device chip of claim 19 in which the active area is free of contact holes to the first conductive material.

21. The split-gate trench device chip of claim 20 in which the active area is into a plurality of blocks with active trenches disposed in each block.

22. The split-gate trench device chip of claim 21 in which metal leads connect the block serially, in parallel, or in combination.

* * * * *